United States Patent [19]

Sung

[11] Patent Number: 5,304,779
[45] Date of Patent: Apr. 19, 1994

[54] SEMICONDUCTOR PREHEATER WITH INCLINED ROTARY FEED

[75] Inventor: Yong G. Sung, Kyungsangbook, Rep. of Korea

[73] Assignee: Goldstar Electron Co., Ltd., Choongchungbook, Rep. of Korea

[21] Appl. No.: 880,773

[22] Filed: May 11, 1992

[30] Foreign Application Priority Data

May 13, 1991 [KR] Rep. of Korea ................. 7691/1991

[51] Int. Cl.⁵ .......................................... H01L 21/00
[52] U.S. Cl. ................................ 219/388; 324/158 F; 432/124
[58] Field of Search ............... 219/388, 389; 432/124; 324/158 F; 414/DIG. 1

[56] References Cited

U.S. PATENT DOCUMENTS

| | | | |
|---|---|---|---|
| 2,855,113 | 10/1958 | Roske | 221/182 |
| 3,748,089 | 7/1973 | Boyer et al. | 432/52 |
| 4,790,438 | 12/1988 | Wilhelm et al. | 324/158 F |
| 5,009,590 | 4/1991 | Mitarai et al. | 432/121 |
| 5,100,315 | 3/1992 | Schodorf et al. | 432/124 |
| 5,121,052 | 6/1992 | Nickerson . | |
| 5,207,987 | 5/1993 | Kureshy et al. | 219/388 |

FOREIGN PATENT DOCUMENTS 61-116674 6/1986 Japan ................................... 219/388

Primary Examiner—Bruce A. Reynolds
Assistant Examiner—John A. Jeffery
Attorney, Agent, or Firm—Lowe, Price, LeBlanc & Becker

[57] ABSTRACT

An apparatus for preheating semiconductor devices including a base having a slanted surface, a frame mounted on the slanted surface, a rotary shaft mounted between support plates of the frame, storage chutes radially provided between rotary disks fixed to the rotary shaft for containing semiconductors to be heated therein, a heater surrounding the storage chutes for heating the storage chutes, a motor for rotating the storage chutes at a predetermined angle, a sensing unit for sensing the supply and discharge of semiconductor devices to and from the storage chutes and the rotational angle of the rotary shaft, and a discharging unit for discharging semiconductor devices from the storage chutes. The semiconductor devices contained in the storage chutes are supplied and discharged to and from the storage chutes by use of a single inlet and outlet and are heated while rotating the storage chutes at a predetermined angle, thereby obtaining a uniform heating of semiconductor devices and an automation of preheating procedure.

4 Claims, 5 Drawing Sheets

SEMICONDUCTOR PREHEATER WITH INCLINED ROTARY FEED

BACKGROUND OF THE INVENTION

1. Field of the Invention

The present invention relates to a preheating apparatus which is utilized in measuring devices such as a test handler which measures the performance of semiconductor device at a high temperature and more particularly, to a semiconductor device preheating apparatus which has an excellent uniform heating capability and is easy in manufacture and control.

2. Description of the Prior Art

Various types of the preheating apparatuses for use in a test handler are well known in the art. One conventional preheating apparatus is illustrated in FIGS. 1 and 2. As shown in FIGS. 1 and 2, the conventional preheating apparatus comprises a hot tray 41, a heater 40 attached at the rear surface of the hot tray 41, a plurality of partitions 42 fixed in front of the hot tray 41 at a predetermined interval for forming a plurality of heating chambers 41a containing and heating semiconductor devices 43 therein, and a stop bar 45 provided at the lower side of the hot tray 41 for blocking the semiconductor devices 43 which are dropped down from respective heating chambers 41a.

In addition, a motor 41 is mounted at one side of the hot tray 41 and a pair of drive sprockets 46 are mounted at a shaft 45' of the motor 41. The drive sprockets 46 are connected to a pair of driven sprockets (not shown) by means of a pair of chains 47.

Also, a plurality of cleat members 48 are attached to the chains 47 so that they may be conveyed together with the chains 47. And, a number of solenoids 49 are mounted at the lower side of respective heating chambers 41a so that their plunger rods 49a penetrate each passage of the heating chambers 41a. That is, the passage of the respective heating chambers 41a is opened or closed by the respective plunger rod 49a of the solenoid 49. In FIG. 2, reference numeral 50 is a cover plate of the apparatus.

In such a conventional apparatus, when semiconductor devices 43 are supplied consecutively through the upper portion of each of the heating chambers 41a of the hot tray 41, the semiconductor devices 43 are stored in the heating chambers 41a by the plunger rods 49a of the solenoid 49 and preheated by heat from the heater 40. After a predetermined time has elapsed, the heating chambers 41a are opened in turn by the operation of the solenoids 49 so that the semiconductor devices 43 are held by the stop bar 44. In this state, the cleats 48 are moved toward the outlet 51 by the driving force from the motor 45 so that the semiconductor devices 43 which have been laid on the stop bar 44 are conveyed by the cleats 48 and dropped down in turn through the outlet 51.

Such a conventional apparatus, however, has disadvantages in that since the construction is relatively complicated it is improper for a small-sized measuring device and expensive in manufacturing cost. Also, since it has a number of inlets for inserting semiconductor devices into the heating chambers, it is difficult to apply the apparatus to automatic system.

SUMMARY OF THE INVENTION

Accordingly, it is an object of the present invention to provide a semiconductor device preheating apparatus which can overcome the above-mentioned problems.

Another object of the present invention is to provide a semiconductor device preheating apparatus which is capable of enhancing the supplying and preheating efficiency of semiconductor devices by providing a plurality of storage chutes within a cylindrical heat chamber, preheating semiconductor devices while supplying and discharging in turn the semiconductor devices to and from the storage chutes by use of a single inlet and an outlet.

It is still another object of the present invention to provide a semiconductor device preheating apparatus which is capable of correctly and easily controlling the supply speed and preheating time of semiconductors by providing sensors an inlet chute and outlet chute for sensing the coming in and out of semiconductor devices and by providing a sensor for sensing the amount of rotation of storage chutes.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Briefly described, the present invention relates to a semiconductor device preheating apparatus which comprises a base having a slanted surface, a frame mounted on said slanted surface, a rotary shaft mounted between support plates of the frame and provided at both ends thereof with rotary disks, storage chutes radially provided between the rotary disks, a heater for heating the storage chutes, a driving unit for rotating the rotary shaft, a sensing unit for sensing the supply or the discharge of semiconductor devices to or from the storage chutes and the rotation angle of the storage chutes, and a discharging unit for discharging semiconductor devices from the storage chutes.

BRIEF DESCRIPTION OF THE DRAWINGS

The present invention will become more fully understood from the detailed description given hereinbelow and the accompanying drawings which are given by way of illustration only, and thus are not limitative of the present inventions, and wherein.

DESCRIPTION OF THE PREFERRED EMBODIMENTS

Figure 1:
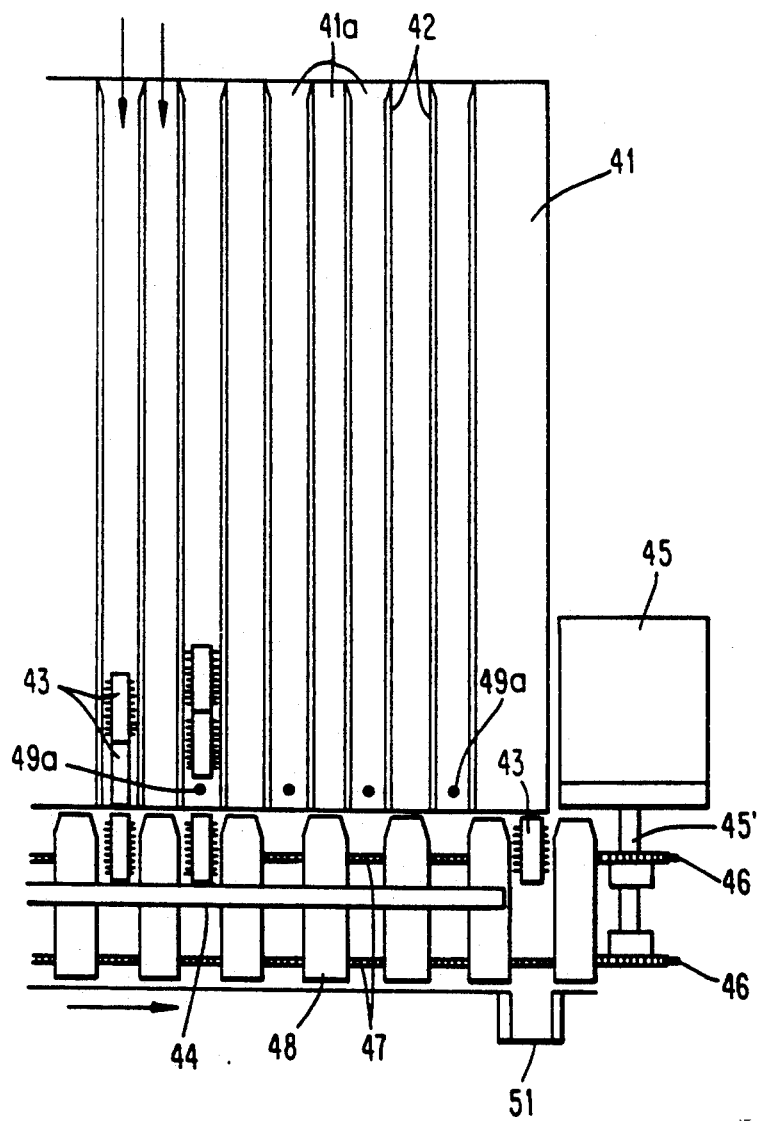
FIG. 1 is a front elevational view of a conventional semiconductor device preheating apparatus.
Figure 2:
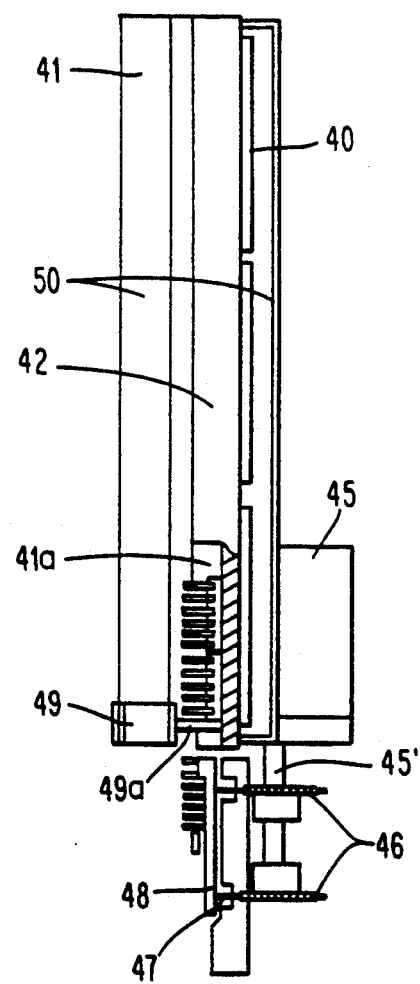
FIG. 2 is a side view of the conventional semiconductor device preheating apparatus.
Figure 3:
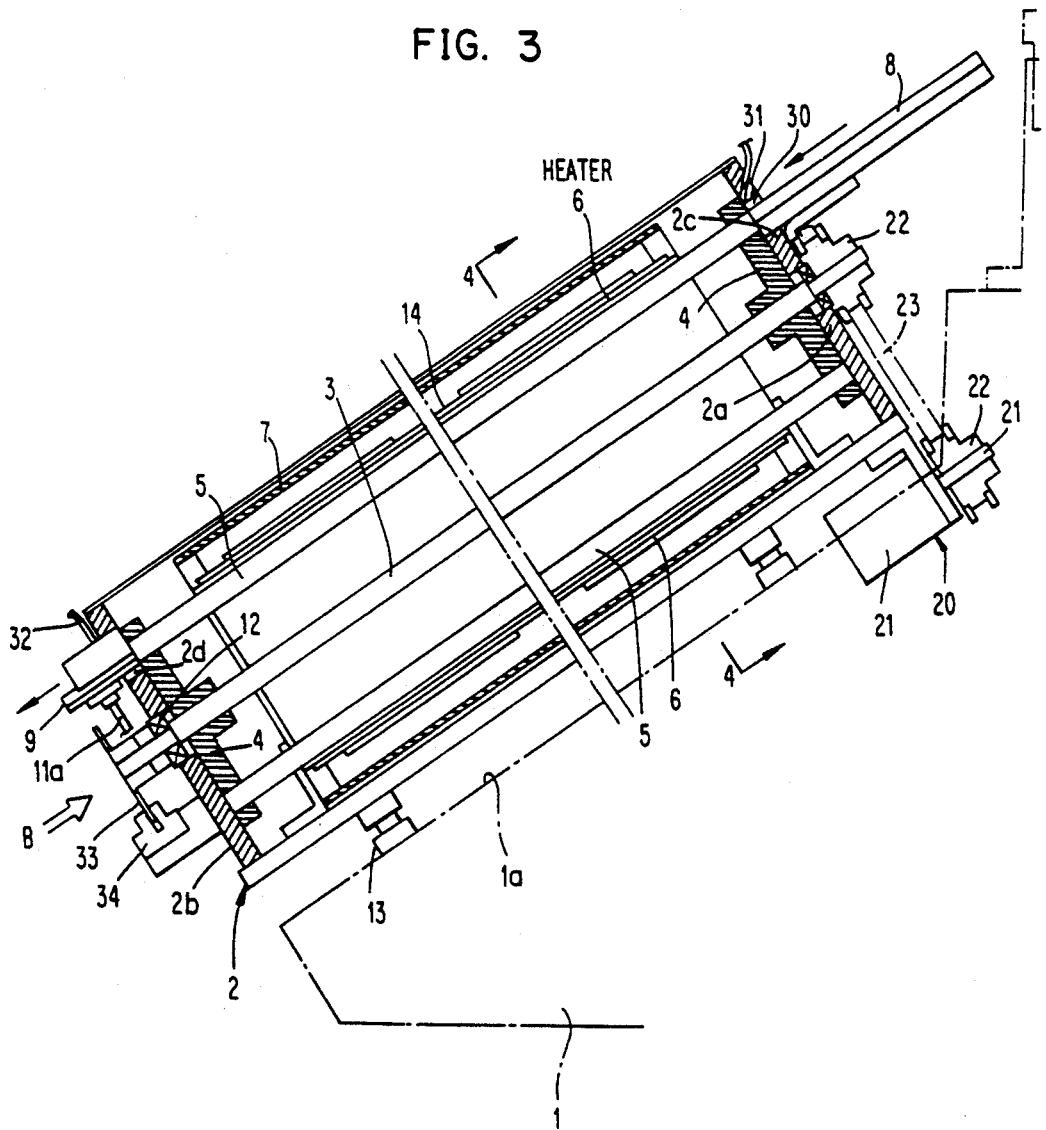
FIG. 3 is a longitudinal sectional view of the semiconductor device preheating apparatus according to the present invention.
Figure 4:
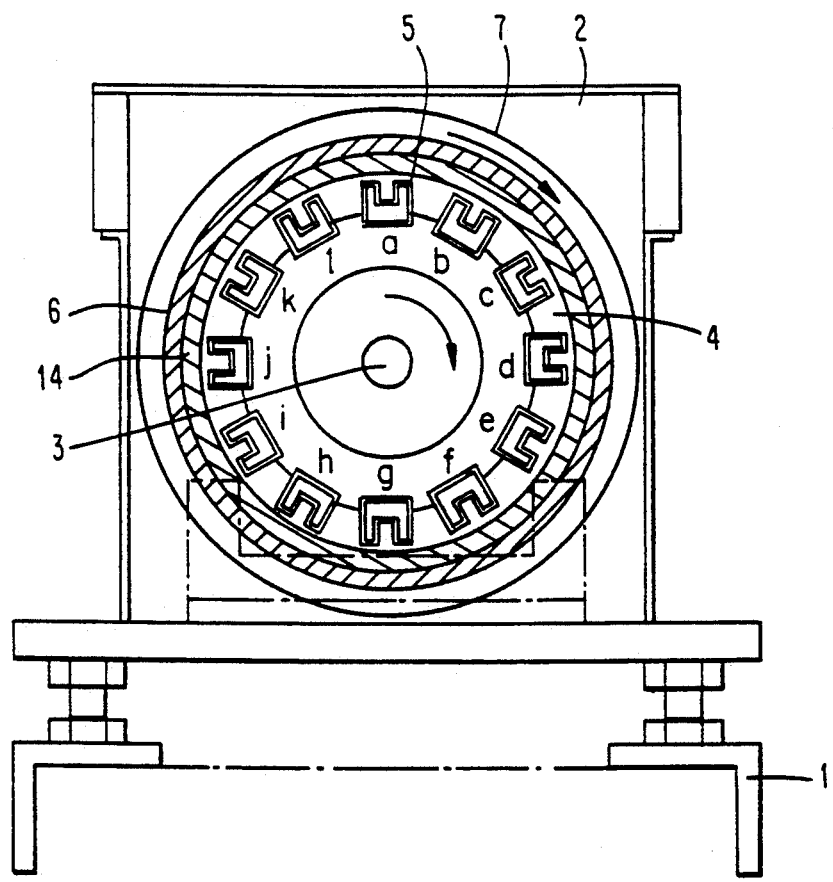
FIG. 4 is a sectional view taken along the line A—A of FIG. 3.
Figure 5:
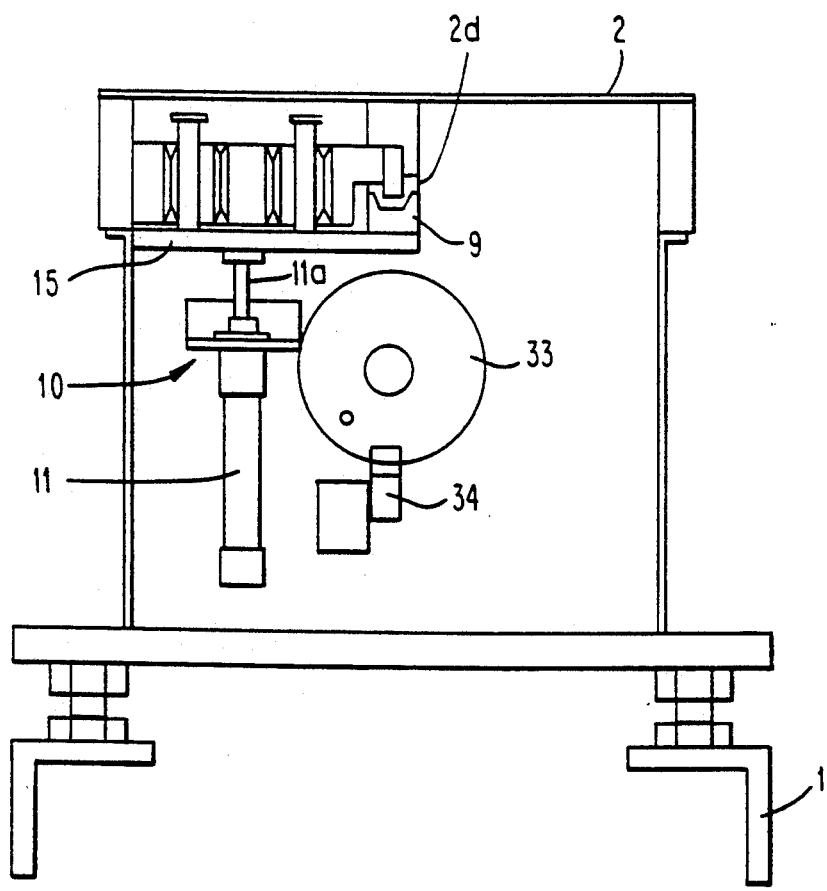
FIG. 5 is a side elevational view of FIG. 3, viewing from direction B.

Referring now in detail to the drawings for the purpose of illustrating preferred embodiments of the present invention, the semiconductor device preheating apparatus as shown in FIGS. 3 to 5, comprises a base 1 having a slanted surface 1a, a frame 2 mounted on the slanted surface 1a of the base 1, a rotary shaft 3 mounted between support plates 2a and 2b of the frame 2, a pair of rotary disks 4 fixed at both ends of the rotary shaft 3, a plurality of storage chutes 5 radially disposed between the rotary disks 4, a heater 6 disposed around the storage chutes 5 for heating the storage chutes 5, a heat chamber 7 supported by and fixed on the frame 2 for condensing heat from the heater 6 toward the storage chutes 5, a driving unit 20 for driving the rotary shaft 3 to rotate the storage chutes 5, a sensing unit 30 for sensing the supply and discharge of semiconductor devices to and from the storage chutes 5 and the amount of rotation of the storage chutes 5, i.e., the rotational angle of the storage chutes 5, and a discharging unit 10 for discharging in turn semiconductor devices which have been stored and preheated in the storage chutes 5, whereby semiconductor devices are stored in turn in the storage chutes 5 and preheated therein and then discharged therefrom consecutively, while rotating the storage chutes 5.

The frame 2 may be formed in a rectangular shape and is mounted on the slanted surface 1a of the base 1 by means of coupling means 13.

The coupling means 13 may have a structure which is capable of adjusting the height of the frame 2 at a predetermined slanted angle, but the frame 2 may be fixed at a predetermined slanted angle in terms of welding or the like at the manufacturing procedure.

The heat chamber 7 is a cylindrical tubular body which has a dimension sufficient to receive therein a plurality of the storage chutes 5 which are mounted between the rotary disks 4.

Within the heat chamber 7, a heater supporting tube 14 enclosing the circumferential surface of the storage chutes 5 is fixed and around the external surface of the heater supporting tube 14, a heater 6 is disposed.

The rotary shaft 3 is rotatably mounted between the support plates 2a of the frame 2 through the intermediary of bearings 12.

On the side support plate 2a, a supply chute 8 for supplying semiconductor devices into the storage chutes 5 is mounted, while at the other side support plate 2b, a discharge chute 9 for discharging semiconductor devices is mounted in a upward and downward movable manner.

The driving unit 20 includes a motor 21 mounted on the frame 2, a pair of pulleys 22 mounted, respectively, on the rotary shaft 3 and the motor shaft 21', and a belt 23 connected between the pulleys 22.

The sensing unit 30 includes an inlet sensor 31 mounted at the supply chute 8, an outlet sensor 32 mounted at the discharge chute 9, a sensing disk 33 fixed on one end of the rotary shaft 3 for sensing the rotational angle of the rotary shaft 3, and a sensor 34 mounted adjacent to the sensing disk 33 for sensing the rotational angel of the rotary shaft 3 together with the sensing disk 33.

The discharging unit 10 includes the discharge chute 9 and a cylinder 11 for moving the discharge chute 9 upwardly and downwardly. The discharge unit 9 is fixed on a movable plate 15 fixed to a plunger 11a of the cylinder 11 so as to be movable upwardly and downwardly.

At the upper portion of each of the support plates 2a and 2b of the frame 2, holes 2c and 2d are provided and in the hole 2c of the support plate 2a, one end of the supply chute 8 is inserted and fixed.

The discharge chute 9 of the discharging unit 10 is positioned adjacent to the support plate 2b so as to close or open the hole 2d of the support plate 2b by the operation of the cylinder 11.

The semiconductor device preheating apparatus of the present invention operates as follows:

Upon supplying a semiconductor device through the supply chute 8, the semiconductor device is stored in the storage chute 5 indicated as "a" in FIG. 4 among the various storage chutes 5 located within the heat chamber 7. At this time, since the discharge chute 9 is moved upwardly the hole 2c of the support plate 2b is closed so that semiconductor devices which have been inserted into the storage chute 5 at the position "a" are stored and filled therein without being discharged downwardly.

When semiconductor devices are filled in full within the storage chute 5 at the position "a", the motor 21 is operated and thus the rotary shaft 3 is rotated by the driving force from the motor 21. As the rotary shaft 3 rotates, the storage chutes 5 is rotated in clockwise and then the semiconductor devices stored in the storage chute 5 at the position "a" are preheated by the heat from the heater 6 at a predetermined temperature.

When the storage chutes 5 are rotated in one step in accordance with the sensing operation of the sensing disk 33 and the sensor 34, that is, when the storage chute 5 at the position "a" is moved to the position "b" and the storage chute 5 at the position "l" is moved to the position "a" and thus all the storage chutes 5 are moved by one step, the discharge chute 9 is moved dowardly to open the hole 2d of the support plate 2b by means of the operation of the cylinder 11, so that the semiconductor devices which have been preheated are discharged from the storage chute 5 which has been moved from the position "l" to "a" through the discharge chute 9. Upon completion of the discharge, the sensor 32 disposed at the outlet side senses this condition and thus the discharge chute 9 is moved upwardly so that the hole 2d of the support plate 2b is closed. At this state, new semiconductor devices at room temperature are filled again in the empty storage chute 5 and when the storage chute 5 is filled in full with semiconductor devices to be preheated, the sensor 31 disposed at the inlet side senses this condition and thus the storage chutes 5 are rotated again by the operation of the motor 21, and such an operation is carried out repeatedly.

As described above in detail the present invention provides the effect that the heating efficiency is extraordinarily enhanced and a uniform heating can be obtained since the semiconductor devices contained in a plurality of storage chutes within a heat chamber are consecutively heated while rotating the storage chutes. Also, since the semiconductor devices are supplied and discharged through a single inlet and outlet, the structure of the supplying and discharging units is very simple so that it may be carried out automatically. Furthermore, it is possible to control precisely and easily the feeding and discharging time and the heating time as well by use of the inlet and outlet sensors and the rotational angle sensor.

The invention being thus described, it will be obvious that the same may be varied in many ways. Such variations are not be regarded as a departure from the spirit and scope of the invention, and all such modifications as would be obvious to one skilled in the art are intended to be included in the scope of the following claims.

What is claimed is:

1. A semiconductor device preheating apparatus, comprising:
   a base having a slanted surface;
   a frame mounted on said slanted surface;
   a rotary shaft provided between support plates of said frame, said rotary shaft having opposite ends;
   two rotary disks, wherein one of said two rotary disks is fixed at each of said opposite ends of said rotary shaft;
   storage chutes radially provided and extending between said two rotary discs;
   a heater for heating said storage chutes;
   a heat chamber for condensing the heat from said heater toward said storage chutes;
   means for driving said rotary shaft to rotate the storage chutes;
   means for sensing the supply or the discharge of semiconductor devices to or from the storage chutes and the amount of rotation of the storage chutes; and
   means for discharging consecutively semiconductor devices contained and preheated in the storage chutes.

2. The apparatus as claimed in claim 1, wherein said driving means comprises a motor mounted on an end of the frame, pulleys fixed respectively at the rotary shaft and a motor shaft, and a belt connected between said pulleys.

3. The apparatus as claimed in claim 1, wherein said sensing means comprises an inlet sensor mounted at a supply chute, an outlet sensor mounted at a discharge chute, a sensing disk fixed at an end of the rotary shaft for sensing the amount of rotation of the rotary shaft, and a sensor for receiving signals from said sensing disk.

4. The apparatus as claimed in claim 1, wherein said discharging means comprises a cylinder fixed at a support plate of the frame, and a discharging chute attached to a movable plate fixed on a plunger of said cylinder for closing and opening an outlet of said support plate of the frame.

* * * * *